(12) United States Patent
Watanabe

(10) Patent No.: US 8,890,229 B2
(45) Date of Patent: Nov. 18, 2014

(54) NONVOLATILE SEMICONDUCTOR MEMORY DEVICE

(71) Applicant: Kabushiki Kaisha Toshiba, Minato-ku (JP)

(72) Inventor: Nobutaka Watanabe, Mei-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/012,218

(22) Filed: Aug. 28, 2013

(65) Prior Publication Data

US 2014/0284675 A1 Sep. 25, 2014

(51) Int. Cl.
*H01L 29/76* (2006.01)
*H01L 29/49* (2006.01)
*H01L 29/417* (2006.01)
*H01L 29/78* (2006.01)

(52) U.S. Cl.
CPC ............... *H01L 29/78* (2013.01); *H01L 29/49* (2013.01); *H01L 29/41725* (2013.01)
USPC .... 257/314; 257/315; 257/316; 257/E29.129; 257/E29.3

(58) Field of Classification Search
CPC ............. H01L 29/788; H01L 29/7841; H01L 27/10802; H01L 27/11517; H01L 29/42324; H01L 29/42328; H01L 29/66825
USPC .......... 257/314, 315, 316, 319, 320, E29.129, 257/E29.3
See application file for complete search history.

(56) References Cited

U.S. PATENT DOCUMENTS

| | | | |
|---|---|---|---|
| 7,799,672 B2 | 9/2010 | Hashimoto et al. | |
| 7,936,004 B2 | 5/2011 | Kito et al. | |
| 8,304,348 B2 | 11/2012 | Hashimoto | |
| 8,338,956 B2 | 12/2012 | Maeda | |
| 2010/0052042 A1 | 3/2010 | Tanaka et al. | |
| 2010/0207186 A1 | 8/2010 | Higashi et al. | |
| 2010/0207240 A1 | 8/2010 | Hashimoto et al. | |
| 2010/0323505 A1 | 12/2010 | Ishikawa et al. | |
| 2011/0031630 A1 | 2/2011 | Hashimoto | |
| 2011/0108907 A1 | 5/2011 | Maeda | |
| 2011/0244666 A1 | 10/2011 | Kim et al. | |
| 2014/0167131 A1* | 6/2014 | Lu et al. ..................... 257/316 |

FOREIGN PATENT DOCUMENTS

| | | | |
|---|---|---|---|
| JP | 2010-192646 A | 9/2010 | |
| JP | 2011-003722 A | 1/2011 | |
| JP | 2011-035237 A | 2/2011 | |
| JP | 2011-100921 A | 5/2011 | |
| JP | 2011-222994 A | 11/2011 | |

* cited by examiner

*Primary Examiner* — Hoai V Pham
(74) *Attorney, Agent, or Firm* — Oblon, Spivak, McClelland, Maier & Neustadt, L.L.P.

(57) ABSTRACT

According to one embodiment, a nonvolatile semiconductor memory device includes a foundation layer; and a stacked body provided on the foundation layer, each of a plurality of electrode layers and each of a plurality of insulating layers being stacked alternately in the stacked body; a select gate electrode provided on the stacked body; and a semiconductor layer extending from an upper end of the select gate electrode to a lower end of the stacked body. The stacked body includes a plurality of staircase regions. The each of the plurality of electrode layers includes an exposed portion. The exposed portion is not covered with the plurality of electrode layers other than the each of the plurality of electrode layers and the plurality of insulating layers. And the exposed portion of each of the plurality of electrode layers is disposed in one of the plurality of staircase regions.

11 Claims, 9 Drawing Sheets

NONVOLATILE SEMICONDUCTOR MEMORY DEVICE

CROSS-REFERENCE TO RELATED APPLICATIONS

This application is based upon and claims the benefit of priority from Japanese Patent Application No. 2013-057268, filed on Mar. 19, 2013; the entire contents of which are incorporated herein by reference.

FIELD

Embodiments described herein relate generally to a nonvolatile semiconductor memory device.

BACKGROUND

To increase the memory capacity of a nonvolatile semiconductor memory device, a method for forming three-dimensional memory cells can be considered. In this method, memory holes are formed in a stacked body in which control electrodes are stacked. A memory film is provided on the sidewall of this memory hole. Furthermore, a channel body layer is provided on the sidewall of this memory film. A plurality of such memory cells can be placed in each block of the stacked body. The operation of erasing data can be collectively performed for each block.

However, in this kind of nonvolatile semiconductor memory device, with the increase in the number of control electrode layers, as many extraction lines as the number of control electrode layers are needed. The extraction lines need to be insulated from each other in the same block. As a method for realizing this in the nonvolatile semiconductor memory device, the extraction lines may be spaced from each other. However, with the increase in the number of layers, the block width is inevitably widened.

In this context, a structure can be considered in which a prescribed region of the stacked body is configured as a staircase region with each control electrode shaped like a stair. In this staircase region, an extraction line is connected to each control electrode. As another structure, the staircase region can be configured like a checkerboard. In such structures, the increase of block width is suppressed.

However, the number of stairs of the staircase region still increases with the increase in the number of layers of the stacked body. Thus, there is demand for a new way to suppress the increase of block width with the increase in the number of layers of the stacked body.

DETAILED DESCRIPTION

Figure 1:
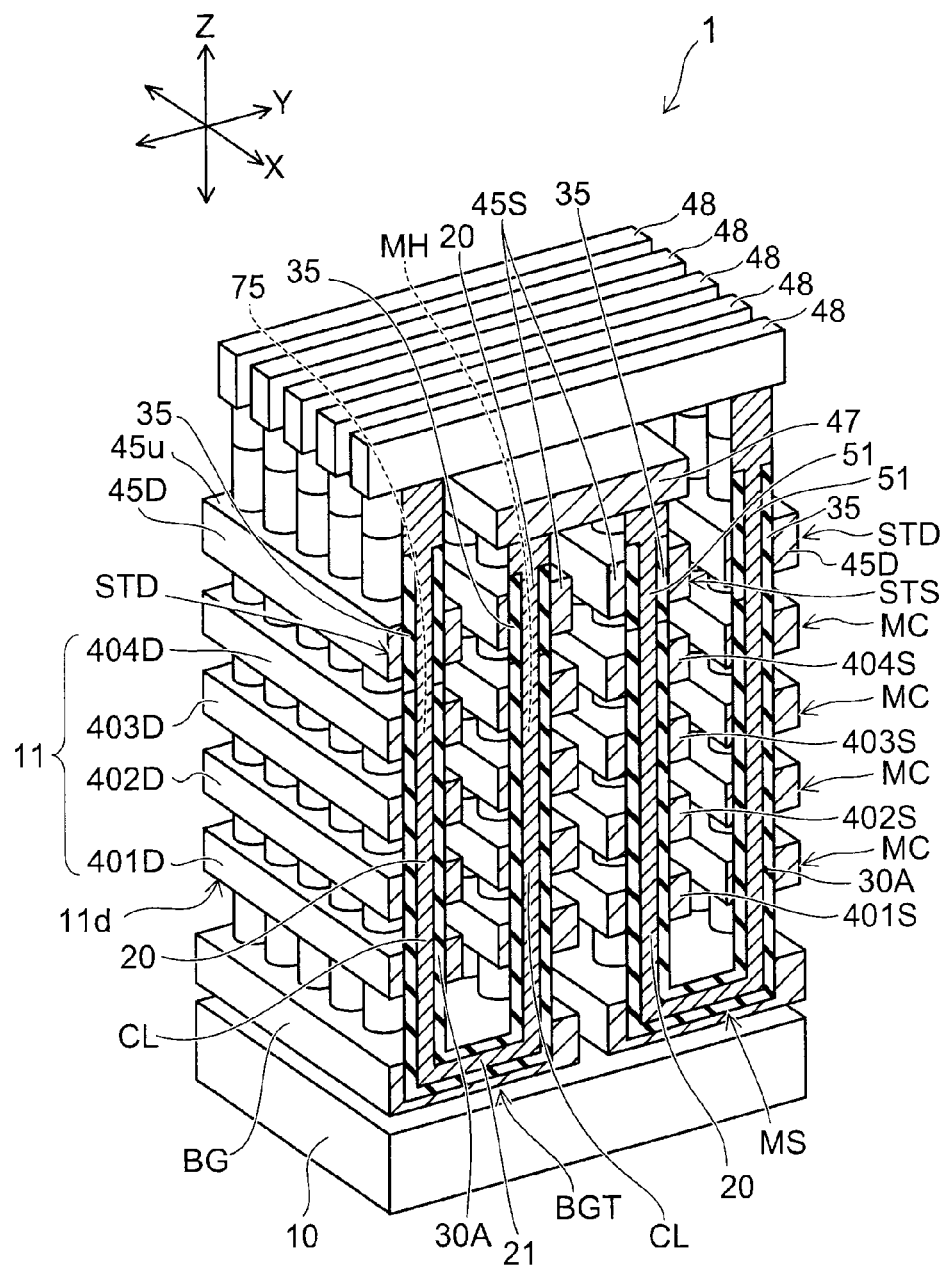
FIG. 1 is a schematic perspective view of a memory cell array of the nonvolatile semiconductor memory device according to the first embodiment.

In general, according to one embodiment, a nonvolatile semiconductor memory device includes a foundation layer; and a stacked body provided on the foundation layer, each of a plurality of electrode layers and each of a plurality of insulating layers being stacked alternately in the stacked body; a select gate electrode provided on the stacked body; a semiconductor layer extending from an upper end of the select gate electrode to a lower end of the stacked body; a first insulating film provided between the semiconductor layer and each of the plurality of electrode layers; and a second insulating film provided between the select gate electrode and the semiconductor layer.

The stacked body includes a plurality of staircase regions. The each of the plurality of electrode layers includes an exposed portion. The exposed portion is not covered with the plurality of electrode layers other than the each of the plurality of electrode layers and the plurality of insulating layers. And the exposed portion of each of the plurality of electrode layers is disposed in one of the plurality of staircase regions.

Embodiments will now be described with reference to the drawings. In the following description, like members are labeled with like reference numerals. The description of the members once described is omitted appropriately.

First Embodiment

An overview of the memory cells of a nonvolatile semiconductor memory device according to a first embodiment is described.

FIG. 1 is a schematic perspective view of a memory cell array of the nonvolatile semiconductor memory device according to the first embodiment.

Figure 2:
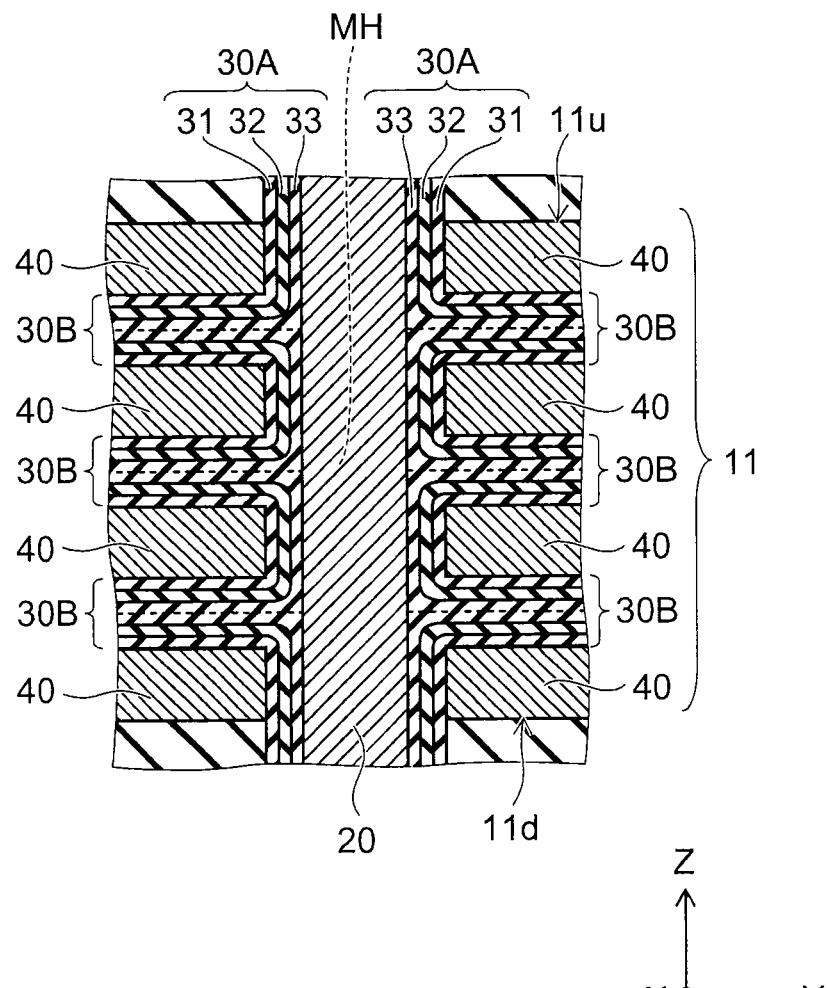
FIG. 2 is an enlarged sectional view of the memory cell section in FIG. 1.

FIG. 2 is an enlarged sectional view of the memory cell section in FIG. 1.

In FIG. 1, for clarity of illustration, insulating portions other than the insulating film formed on the inner wall of the memory hole MH are not shown.

In FIG. 1, for convenience of description, an XYZ orthogonal coordinate system is introduced. In this coordinate system, two directions parallel to the major surface of the substrate 10 and orthogonal to each other are referred to as X direction and Y direction. The direction orthogonal to both these X and Y directions is referred to as Z direction.

In the nonvolatile semiconductor memory device 1, on a substrate 10, a back gate BG is provided via an insulating layer, not shown. The substrate 10 and this insulating layer are collectively referred to as foundation layer. In the substrate 10, active elements such as transistors, and passive elements such as resistors and capacitors are provided. The back gate BG is e.g. a silicon (Si) layer doped with an impurity element.

On the back gate BG, a plurality of insulating layers 30B (see FIG. 2), each of drain side electrode layers 401D, 402D, 403D, 404D, and each of source side electrode layers 401S, 402S, 403S, 404S are stacked alternately one by one.

The electrode layer 401D and the electrode layer 401S are provided at the same level and represent first lowest electrode layers. The electrode layer 402D and the electrode layer 402S are provided at the same level and represent second lowest electrode layers.

The electrode layer 403D and the electrode layer 403S are provided at the same level and represent third lowest electrode layers. The electrode layer 404D and the electrode layer 404S are provided at the same level and represent fourth lowest electrode layers.

The electrode layer 401D and the electrode layer 401S are divided in the Y direction. The electrode layer 402D and the electrode layer 402S are divided in the Y direction. The electrode layer 403D and the electrode layer 403S are divided in the Y direction. The electrode layer 404D and the electrode layer 404S are divided in the Y direction.

An insulating layer, not shown, is provided between the electrode layer 401D and the electrode layer 401S, between the electrode layer 402D and the electrode layer 402S, between the electrode layer 403D and the electrode layer 403S, and between the electrode layer 404D and the electrode layer 404S.

The electrode layers 401D, 402D, 403D, 404D are provided between the back gate BG and a drain side select gate electrode 45D. The electrode layers 401S, 402S, 403S, 404S are provided between the back gate BG and a source side select gate electrode 45S.

The number of layers of the electrode layers 401D, 402D, 403D, 404D, 401S, 402S, 403S, 404S is arbitrary, and not limited to four layers illustrated in FIG. 1. In the following description, the electrode layers 401D, 402D, 403D, 404D, 401S, 402S, 403S, 404S may also be simply referred to as electrode layers 40.

The electrode layer 40 is e.g. a silicon layer doped with impurity and having conductivity. The insulating layer 30B may have e.g. an ONO structure described later, or may include a monolayer insulating layer (e.g., silicon oxide layer). By way of example, the insulating layer 30B has an ONO structure (described later).

On the electrode layer 404D, a drain side select gate electrode 45D is provided via an insulating layer, not shown. The drain side select gate electrode 45D is e.g. a silicon layer doped with impurity and having conductivity.

On the electrode layer 404S, a source side select gate electrode 45S is provided via an insulating layer, not shown. The source side select gate electrode 45S is e.g. a silicon layer doped with impurity and having conductivity.

The drain side select gate electrode 45D and the source side select gate electrode 45S are divided in the Y direction. The drain side select gate electrode 45D and the source side select gate electrode 45S may also be simply referred to as select gate electrode 45 without distinction.

On the source side select gate electrode 45S, a source line 47 is provided via an insulating layer, not shown. The source line 47 is a metal layer, or a silicon layer doped with impurity and having conductivity.

On the drain side select gate electrode 45D and the source line 47, a plurality of bit lines 48 are provided via an insulating layer, not shown. The bit line 48 extends in the Y direction.

In the back gate BG and the stacked body 11 on this back gate BG, a plurality of U-shaped memory holes MH are formed. For instance, in the electrode layers 401D-404D and the drain side select gate electrode 45D, holes penetrating therethrough and extending in the Z direction are formed. In the electrode layers 401S-404S and the source side select gate electrode 45S, holes penetrating therethrough and extending in the Z direction are formed. A pair of the holes extending in the Z direction are linked via a recess (space portion) formed in the back gate BG to constitute a U-shaped memory hole MH.

Inside the memory hole MH, a channel body layer 20 (semiconductor layer) is provided in a U-shape. The channel body layer 20 is e.g. a silicon layer. A memory film 30A (first insulating film) is provided between the channel body layer 20 and the inner wall of the memory hole MH.

A gate insulating film 35 (second insulating film) is provided between the channel body layer 20 and the drain side select gate electrode 45D. A gate insulating film 35 is provided between the channel body layer 20 and the source side select gate electrode 45S.

Here, the embodiment is not limited to the structure in which the inside of the memory hole MH is entirely filled with the channel body layer 20. As an alternative structure, the channel body layer 20 may be formed so as to leave a void portion on the central axis side of the memory hole MH, and the inside void portion may be filled with insulator.

The memory film 30A has e.g. an ONO (oxide-nitride-oxide) structure in which a silicon nitride film is sandwiched between a pair of silicon oxide films. As shown in FIG. 2, between the electrode layer 40 and the channel body layer 20, sequentially from the electrode layer 40 side, an insulating film 31, a charge accumulation film 32, and an insulating film 33 are provided. The insulating film 31 is in contact with the electrode layer 40. The insulating film 33 is in contact with the channel body layer 20. The charge accumulation film 32 is provided between the insulating film 31 and the insulating film 33. Here, between the electrode layers 40, an insulating layer 30B is provided. The insulating layer 30B has a two-layer ONO structure. The insulating film 31 is e.g. a silicon oxide film. The charge accumulation film 32 is e.g. a silicon nitride film. The insulating film 33 is e.g. a silicon oxide film.

The channel body layer 20 functions as a channel in a transistor constituting a memory cell. The electrode layer 40 functions as a control gate. The charge accumulation film 32 functions as a data memory layer for accumulating charge injected from the channel body layer 20. That is, at the intersection of the channel body layer 20 and the electrode layer 40, a memory cell MC having a structure with the channel surrounded with the control gate is formed.

The nonvolatile semiconductor memory device 1 of the first embodiment is a nonvolatile semiconductor memory device capable of electrically and freely erasing/writing data and retaining its memory content even when powered off.

The drain side select gate electrode 45D, the channel body layer 20, and the gate insulating film 35 therebetween constitute a drain side select transistor STD. The channel body layer 20 above the drain side select transistor STD is connected to a bit line 48.

The source side select gate electrode 45S, the channel body layer 20, and the gate insulating film 35 therebetween constitute a source side select transistor STS. The channel body layer 20 above the source side select transistor STS is connected to a source line 47.

The back gate BG, the channel body layer 20 provided in this back gate BG, and the memory film 30A constitute a back gate transistor BGT.

A plurality of memory cells MC with the electrode layers 404D-401D serving as control gates are provided between the drain side select transistor STD and the back gate transistor BGT. Similarly, a plurality of memory cells MC with the electrode layers 401S-404S serving as control gates are provided between the back gate transistor BGT and the source side select transistor STS.

The plurality of memory cells MC, the drain side select transistor STD, the back gate transistor BGT, and the source side select transistor STS are series connected via the channel body layer 20 to constitute one U-shaped memory string MS.

One memory string MS includes a pair of columnar portions CL extending in the stacking direction of the stacked body 11 including a plurality of electrode layers 40, and a linking portion 21 embedded in the back gate BG and linking the pair of columnar portions CL. A plurality of such memory strings MS are arranged in the X direction and the Y direction. Thus, a plurality of memory cells are provided three-dimensionally in the X direction, the Y direction, and the Z direction.

The plurality of memory strings MS are provided on a memory cell array region in the substrate 10. Around the periphery, for instance, of the memory cell array region in the substrate 10, a peripheral circuit for controlling the memory cell array is provided.

Figure 3:
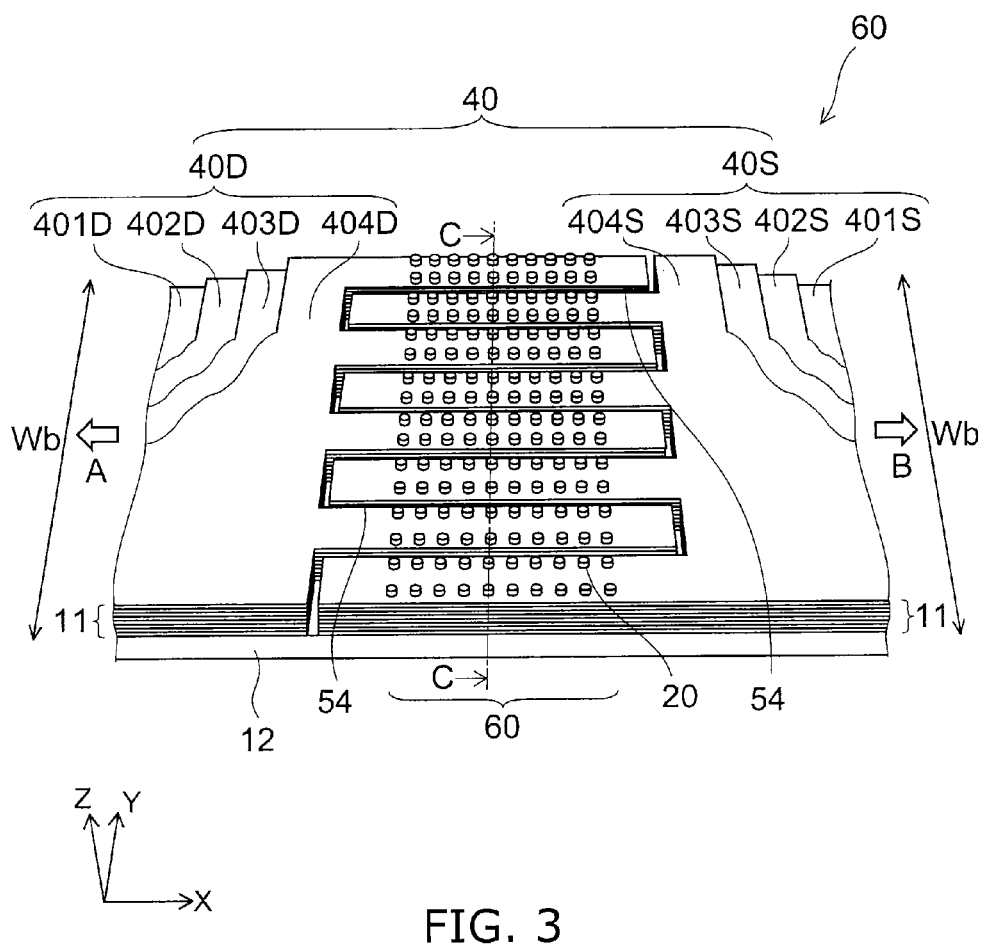
FIG. 3 is a schematic perspective view of the nonvolatile semiconductor memory device according to the first embodiment.

FIG. 3 is a schematic perspective view of the nonvolatile semiconductor memory device according to the first embodiment.

More specifically, FIG. 3 illustrates a general view of the nonvolatile semiconductor memory device 1 including memory cells. FIG. 3 shows one block of the nonvolatile semiconductor memory device 1. In the nonvolatile semiconductor memory device 1, such blocks are arranged in the Y direction via slits. The width in the Y direction of one block is denoted by Wb. In FIG. 3, in order to describe the structure of the stacked body 11, the structure above the stacked body 11 is not shown. The cross section taken along line C-C in FIG. 3 corresponds to the front in FIG. 1.

As shown in FIG. 3, in the cell region 60 of the nonvolatile semiconductor memory device 1, on a foundation layer 12, electrode layers 40 are stacked in the Z direction. Each electrode layer 40 is divided into a drain side electrode layer 40D and a source side electrode layer 40S by a slit 54 provided in the X-Y plane. The drain side electrode layers 40D include the electrode layers 401D, 402D, 403D, 404D. The source side electrode layers 40S include the electrode layers 401S, 402S, 403S, 404S.

The slit 54 is a groove extending in the X direction and the Y direction. As viewed in the Z direction, the slit 54 is shaped like a rectangular wave. In the electrode layers 40 at each level, as viewed in the Z direction, the electrode layer 40D and the electrode layer 40S are meshed with each other via the slit 54. As viewed in the Z direction, in each of the electrode layer 40D and the electrode layer 40S, channel body layers 20 are arranged in two rows in the X direction. In the nonvolatile semiconductor memory device 1, the drain side electrode layer 40 and the source side electrode layer 40 are extracted in the opposite directions (−X direction and +X direction).

The stacked body 11 with the drain side electrode layers 40 stacked therein further extends in the direction of arrow A without interruption. The stacked body 11 with the source side electrode layers 40 stacked therein further extends in the direction of arrow B without interruption. In the nonvolatile semiconductor memory device 1, the direction of arrow A (−X direction) or the direction of arrow B (+X direction) is defined as longitudinal direction (extending direction of the stacked body 11). In this case, the direction of the width Wb corresponds to the transverse direction.

In FIG. 3, electrode layers 40 in a four-layer structure are illustrated. However, the embodiment is not limited to this number of layers. For instance, the number of stacked layers of the electrode layers 40 is arbitrary. The number of channel body layers 20 provided in the X direction is also arbitrary.

Thus, the nonvolatile semiconductor memory device 1 includes a foundation layer 12, a stacked body 11, a select gate electrode 45, a channel body layer 20, a memory film 30A, and a gate insulating film 35. The stacked body 11 is provided on the foundation layer 12. In the stacked body 11, each of a plurality of electrode layers 40 and each of a plurality of insulating layers 30B are stacked alternately one by one. The select gate electrode 45 is provided on the stacked body 11. The channel body layer 20 extends from the upper end 45u of the select gate electrode 45 to the lower end 11d of the stacked body 11. The memory film 30A is provided between the channel body layer 20 and each of the plurality of electrode layers 40. The gate insulating film 35 is provided between the select gate electrode 45 and the channel body layer 20.

Next, the structure of the stacked body 11 other than the cell region 60 is described in detail. That is, the structure of the stacked body 11 extending in the arrow A direction or arrow B direction is described in detail. In the following, by way of example, the structure of the stacked body 11 extending in either the arrow A direction or arrow B direction is described in detail.

Figure 4:
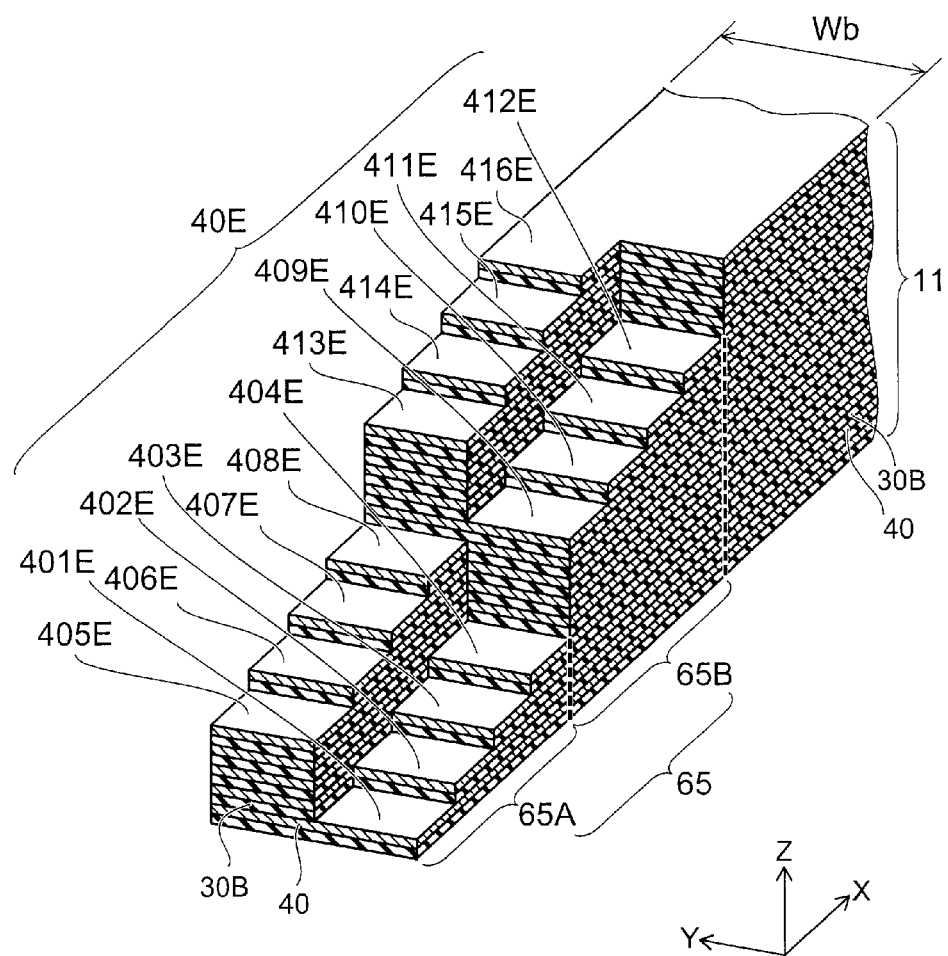
FIG. 4 is a schematic perspective view of the stacked body according to the first embodiment.

FIG. 4 is a schematic perspective view of the stacked body according to the first embodiment.

Figure 5:
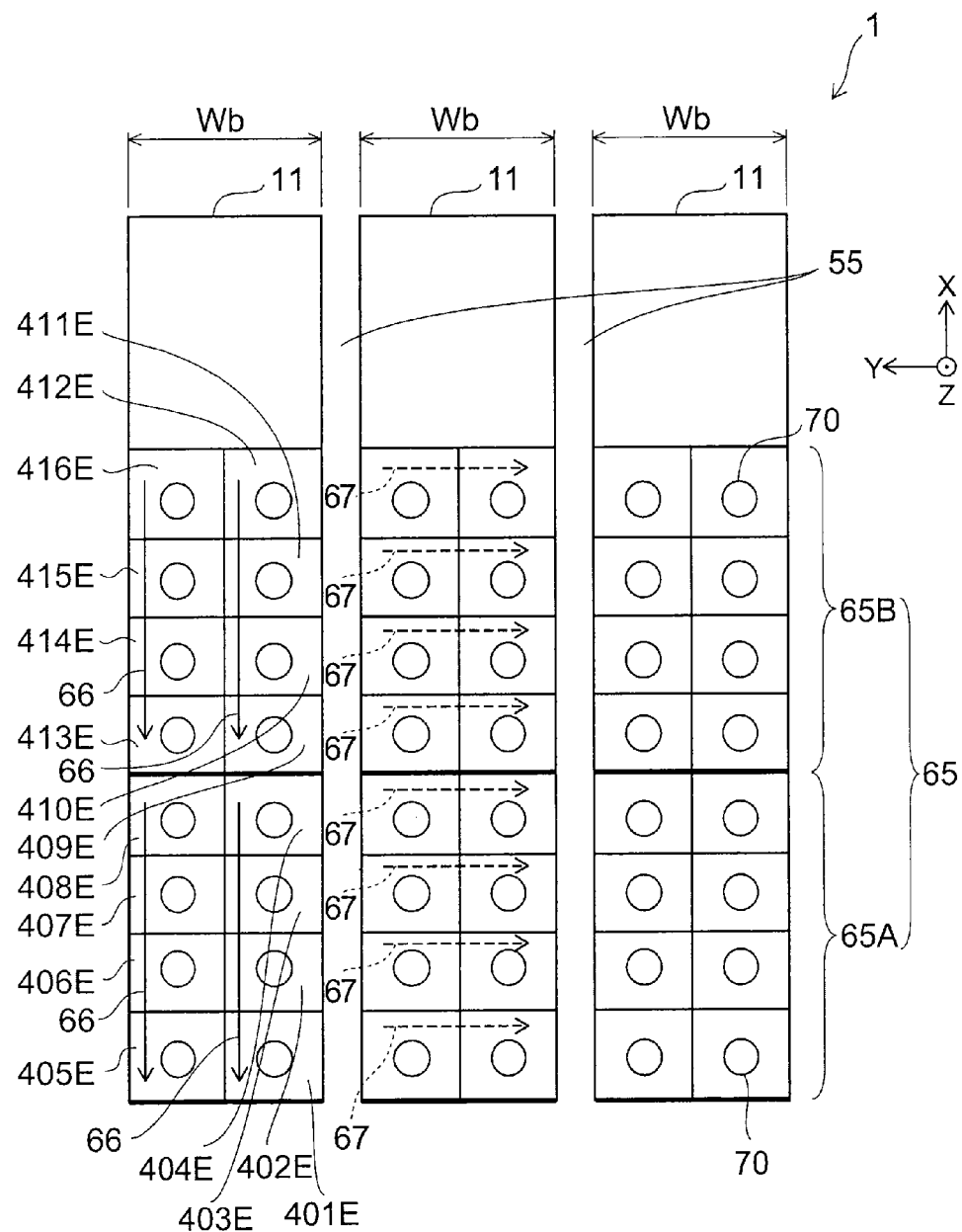
FIG. 5 is a schematic plan view of the stacked body according to the first embodiment.

FIG. 5 is a schematic plan view of the stacked body according to the first embodiment.

By way of example, FIG. 4 illustrates 16 electrode layers 40.

As shown in FIGS. 4 and 5, the stacked body 11 includes a plurality of staircase regions 65. For instance, the plurality of staircase regions 65 include a staircase region 65A (first staircase region) and a staircase region 65B (second staircase region). The staircase regions 65 are arranged in a row in the longitudinal direction (the direction of arrow A) of the stacked body 11 (FIG. 4). For instance, the staircase region 65A and the staircase region 65B are arranged in the extending direction of the stacked body 11 (i.e., the longitudinal direction or X direction). The staircase region 65A and the staircase region 65B may be continuously arranged, or may be spaced from each other. In the figures, by way of example, the state of the staircase region 65B and the staircase region 65A being continuously arranged is shown. The staircase region 65B is disposed nearer to the channel body layer 20 than the staircase region 65A. The staircase region 65B is disposed on a side of the channel body layer 20 than the staircase region 65A side. Furthermore, the units of the stacked body 11 are arranged in the Y direction. A slit 55 exists between the adjacent stacked bodies 11 (FIG. 5). In the nonvolatile semiconductor memory device 1, the stacked body 11 of width Wb constitutes one block.

Each of the plurality of electrode layers 40 includes an exposed portion 40E in one of the plurality of staircase regions 65A, 65B. The exposed portion 40E is not covered with the plurality of electrode layers 40 other than that electrode layer 40 and The exposed portion 40E is not covered with the plurality of insulating layers 30B.

For instance, in the staircase region 65A, the exposed portion 401E is not covered with the plurality of electrode layers 40 other than the electrode layer 40 including the exposed portion 401E and the exposed portion 401E is not covered with the plurality of insulating layers 30B. In the staircase region 65B, the exposed portion 409E is not covered with the plurality of electrode layers 40 other than the electrode layer 40 including the exposed portion 409E and the exposed portion 409E is not covered with the plurality of insulating layers 30B. The same also applies to each of the exposed portions 402E-408E, 410E-416E other than the exposed portions 401E, 409E. The exposed portion 40E of each of the plurality of electrode layers 40 is disposed in one of the plurality of staircase regions 65. In other words, in the nonvolatile semiconductor memory device 1, a plurality of staircase regions 65 are provided, and a plurality of exposed portions 40E are segmented in different groups of staircase regions.

Each of the plurality of staircase regions 65A, 65B includes at least one step sequence 66 (first steps) and at least one step sequence 67 (second steps). The step sequence 66 is a step sequence in which the exposed portions 40E of the plurality of electrode layers 40 are lowered by one step for each shift in the X direction (first direction). The step sequence 66 is a step sequence formed by at least one row of the exposed portions 40E arranged in the X direction perpendicular to the stacking direction (Z direction) of the stacked body 11. The step sequence 67 is a step sequence formed by at least one row of the exposed portions 40E arranged in the Y direction (second direction) perpendicular to the stacking direction and the X direction. In this way, the exposed portions of the plurality of electrode layers are lowered in one step in the first direction in the first steps. The exposed portions of the plurality of electrode layers are lowered in multiple steps in the second direction in the second step.

In each of the plurality of staircase regions 65A, 65B, the exposed portions 40E are arranged so that the number of exposed portions 40E arranged in the Y direction is made smaller than the number of exposed portions 40E arranged in the X direction.

The planar shape of each exposed portion 40E is rectangular. The staircase region 65 is made of a plurality of exposed portions 40E collected like a matrix. Thus, the planar configuration of the staircase region 65 is configured like a checkerboard. To each exposed portion 40E, an interconnect 70 such as a via is connected.

In the planar configuration of each staircase region 65A, 65B, for instance, four exposed portions 40E are arranged in the X direction, and two exposed portions 40E arranged in the Y direction. That is, the planar configuration of each staircase region 65A, 65B includes two step sequences 66 arranged in the X direction and four step sequences 67 arranged in the Y direction.

The staircase region 65A includes the exposed portion 40E of each of the plurality of electrode layers 40 in the lower half of the stacked body 11. The staircase region 65B includes the exposed portion 40E of each of the plurality of electrode layers 40 in the upper half of the stacked body 11. Alternatively, the staircase region 65A may include the exposed portion 40E of each of the plurality of electrode layers 40 in the upper half of the stacked body 11. The staircase region 65B may include the exposed portion 40E of each of the plurality of electrode layers 40 in the lower half of the stacked body 11.

Here, as the step sequence 66, FIG. 4 illustrates a step sequence in which the exposed portions 40E of the plurality of electrode layers 40 are lowered by one step for each shift in the X direction. Besides, the step sequence 67 may be a step sequence in which the exposed portions 40E of the plurality of electrode layers 40 are lowered by one step for each shift in the Y direction.

Furthermore, as the step sequence 67, FIG. 4 illustrates a step sequence in which the exposed portions 40E of the plurality of electrode layers 40 are lowered by a plurality of steps for each shift in the Y direction. Besides, the step sequence 66 may be a step sequence in which the exposed portions 40E of the plurality of electrode layers 40 are lowered by a plurality of steps for each shift in the X direction.

A process for forming the staircase region 65 is now described.

FIGS. 6A to 6E are schematic sectional views showing the basic overview of the process for forming the staircase region.

Figure 6A:
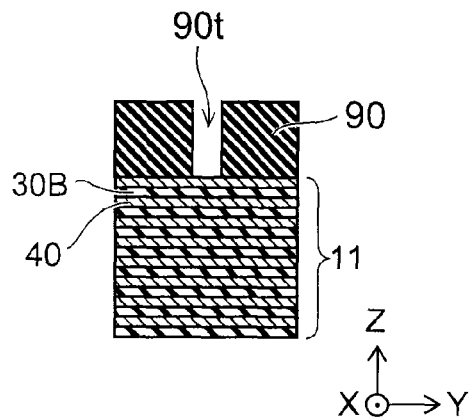
FIGS. 6A to 6E are schematic sectional views showing the basic overview of the process for forming the staircase region.

First, as shown in FIG. 6A, a resist 90 is patterned on the stacked body 11. In the resist 90, a trench 90t extending in the X direction is previously formed.

Figure 6D:
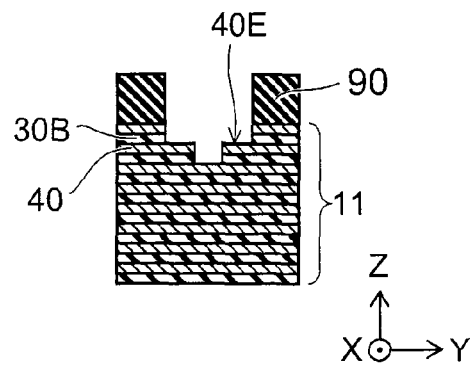
Figure 6B:
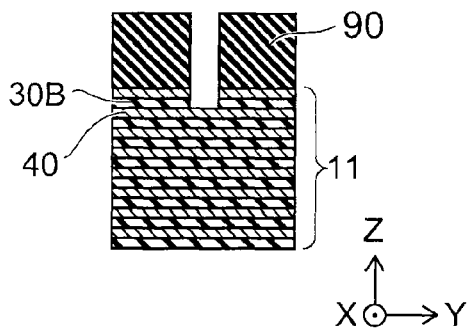
Figure 6E:
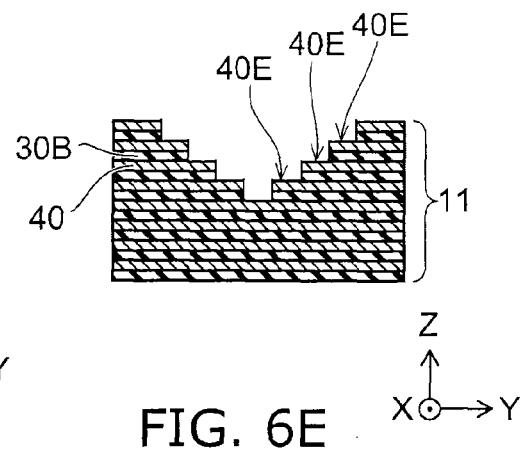

Next, as shown in FIG. 6B, RIE (reactive ion etching) processing is performed on the uppermost electrode layer 40 and the insulating layer 30B therebelow of the stacked body 11.

Figure 6C:
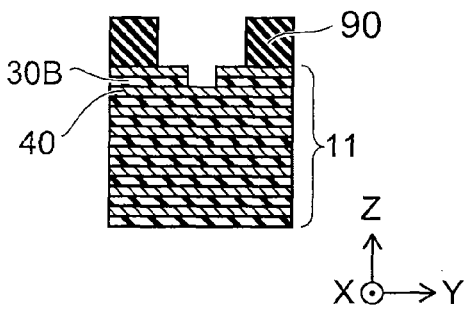

Next, as shown in FIG. 6C, by ashing, the width of the trench 90t of the resist 90 is widened. In the ashing, for instance, an oxygen-containing plasma is used.

Next, as shown in FIG. 6D, the resist 90 and the uppermost electrode layer 40 are used as a mask to perform RIE processing on the uppermost electrode layer 40 and the insulating layer 30B below this electrode layer 40, and the electrode layer 40 below the uppermost electrode layer 40 and the insulating layer 30B below this electrode layer 40. Next, a routine processing for repeating the aforementioned ashing step and the RIE step is repeated to obtain a step sequence shown in FIG. 6E. This step sequence is a step sequence with exposed portions 40E arranged in the Y direction.

Next, the stacked body 11 is rotated by 90° about the Z axis. Next, a resist 90 with a trench 90t extending in the Y direction is formed on the stacked body 11. Then, a processing similar to that of FIGS. 6A to 6E is performed on the stacked body 11. Thus, step sequences with exposed portions 40E arranged in the X direction and the Y direction are obtained.

A plurality of staircase regions 65 are specifically formed in the stacked body 11 by the following manufacturing process.

Figure 7A:
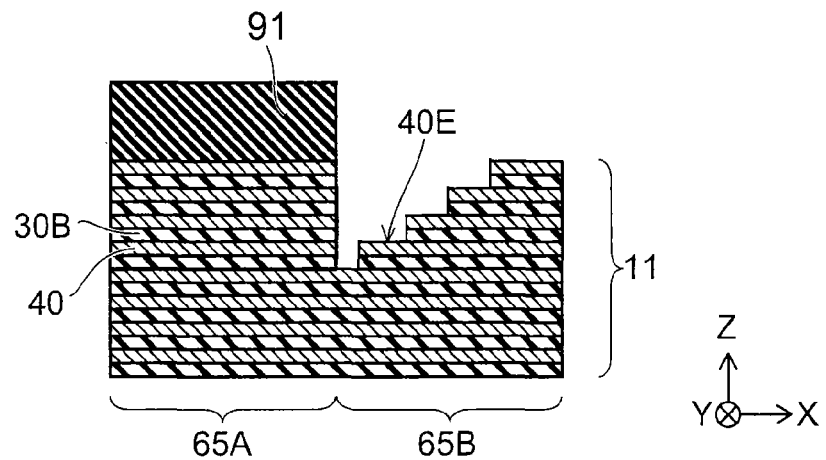
FIGS. 7A to 7C are schematic sectional views showing the process for forming the staircase regions.
Figure 7B:
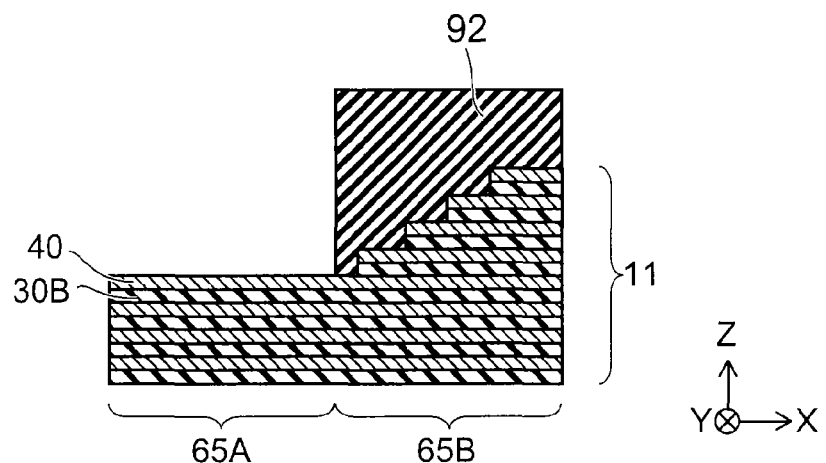
Figure 7C:
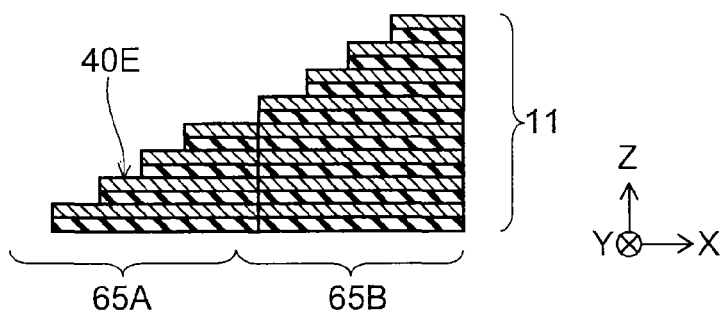

FIGS. 7A to 7C are schematic sectional views showing the process for forming the staircase regions.

First, as shown in FIG. 7A, outside the portion of the stacked body 11 where a staircase region 65B is to be formed, a hard mask 91 is formed. Next, in the portion of the stacked body 11 where a staircase region 65B is to be formed, a staircase region 65B configured like a checkerboard is formed by the aforementioned method.

Next, as shown in FIG. 7B, outside the portion of the stacked body 11 where a staircase region 65A is to be formed, a hard mask 92 is formed. Next, the upper half of the stacked body 11 is removed by etching. Next, in the portion of the stacked body 11 where a staircase region 65A is to be formed, a staircase region 65A configured like a checkerboard is formed by the aforementioned method. This state is shown in FIG. 7C. By such a manufacturing process, a plurality of staircase regions 65 are formed.

Before describing the effect of the nonvolatile semiconductor memory device 1, a staircase region of a stacked body according to a reference example is described.

Figure 8:
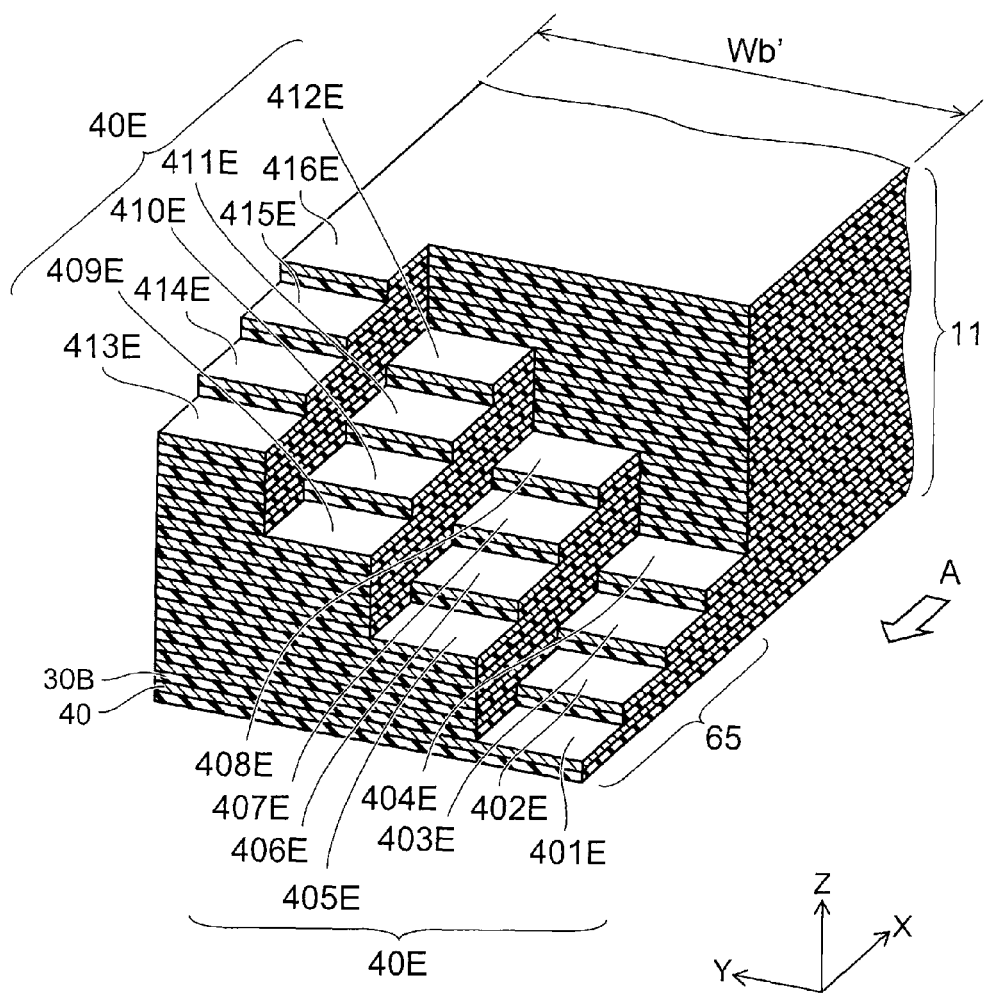
FIG. 8 is a schematic perspective view of the staircase region according to the reference example.

FIG. 8 is a schematic perspective view of the staircase region according to the reference example.

The stacked body 11 according to the reference example does not include a plurality of staircase regions 65. In the reference example, one staircase region 65 is provided in the stacked body 11. In the reference example, in order to expose all the exposed portions 40E from the plurality of electrode layers 40 and the plurality of insulating layers 30B, four exposed portions 40E are arranged in the X direction, and four exposed portions 40E are arranged in the Y direction. That is, the planar configuration of the staircase region 65 according to the reference example includes four step sequences arranged in the X direction and four step sequences arranged in the Y direction.

The block width Wb' of the reference example is twice the block width Wb of the first embodiment. This is because four step sequences arranged in the X direction are formed. Furthermore, in the stacked body 11 according to the reference example, if channel body layers 20 are formed with a pitch similar to that of the first embodiment, twice as many memory cells are formed in one block of the reference example.

The effect of the nonvolatile semiconductor memory device 1 is described by comparison with the reference example.

In the nonvolatile semiconductor memory device 1, the number of exposed portions 40E increases with the increase in the number of layers of the stacked body 11.

In the reference example, the plurality of exposed portions 40E are not segmented in different staircase regions 65. Thus, with the increase in the number of layers of the stacked body 11, the width of the staircase region 65 increases. That is, if the number of layers of the stacked body 11 increases, the block width Wb' increases. In other words, the reference example cannot suppress the increase of the block width corresponding to the increase in the number of layers of the stacked body 11.

In contrast, in the nonvolatile semiconductor memory device 1, each of the plurality of electrode layers 40 includes one exposed portion 40E. Furthermore, the plurality of exposed portions 40E are segmented in different staircase regions 65. Thus, the nonvolatile semiconductor memory device 1 can suppress the increase of the block width corresponding to the increase in the number of layers of the stacked body 11. This is because even if the number of layers of the stacked body 11 increases, the increase of the block width Wb of the staircase region 65 is smaller than in the reference example.

Furthermore, in the nonvolatile semiconductor memory device 1, data erasure may be performed collectively on one block.

In this case, in the erase operation of the reference example, twice as many memory cells are subjected to the erase operation compared with the nonvolatile semiconductor memory device 1.

In contrast, in the erase operation of the nonvolatile semiconductor memory device 1, half memory cells are subjected to the erase operation compared with the reference example. In other words, in the nonvolatile semiconductor memory device 1, the block unit subjected to collective erasure is smaller. That is, in the nonvolatile semiconductor memory device 1, half of the data once written can be retained without erasure. Thus, in the nonvolatile semiconductor memory device 1, the efficiency of the write operation and the erase operation is higher than in the reference example.

Furthermore, in the process for manufacturing the staircase region 65 according to the reference example, the exposed portions 40E of all the electrode layers 40 are formed in one staircase region 65. Thus, the aforementioned routine processing is continued from the uppermost layer to the lowermost layer of the stacked body 11. The number of times of this routine processing is e.g. doubled compared with the process for manufacturing two divided staircase regions 65. With the increase in the number of times of the routine processing, the processing accuracy of the exposed portions 40E is decreased.

In contrast, in the process for manufacturing the staircase regions 65 of the nonvolatile semiconductor memory device 1, the exposed portion 40E of the electrode layer 40 is formed in each of the plurality of staircase regions 65. Thus, in each of the plurality of staircase regions 65, the number of times of the routine processing is half or less compared with the manufacturing process of the reference example.

By reducing the number of times of the routine processing, in the process for manufacturing the staircase regions 65 of the nonvolatile semiconductor memory device 1, the dimensional variation of each exposed portion 40E is suppressed. That is, in the manufacturing process of the nonvolatile semiconductor memory device 1, the dimensional accuracy of the exposed portion 40E in each layer is made higher than in the manufacturing process of the reference example.

Second Embodiment

Figure 9:
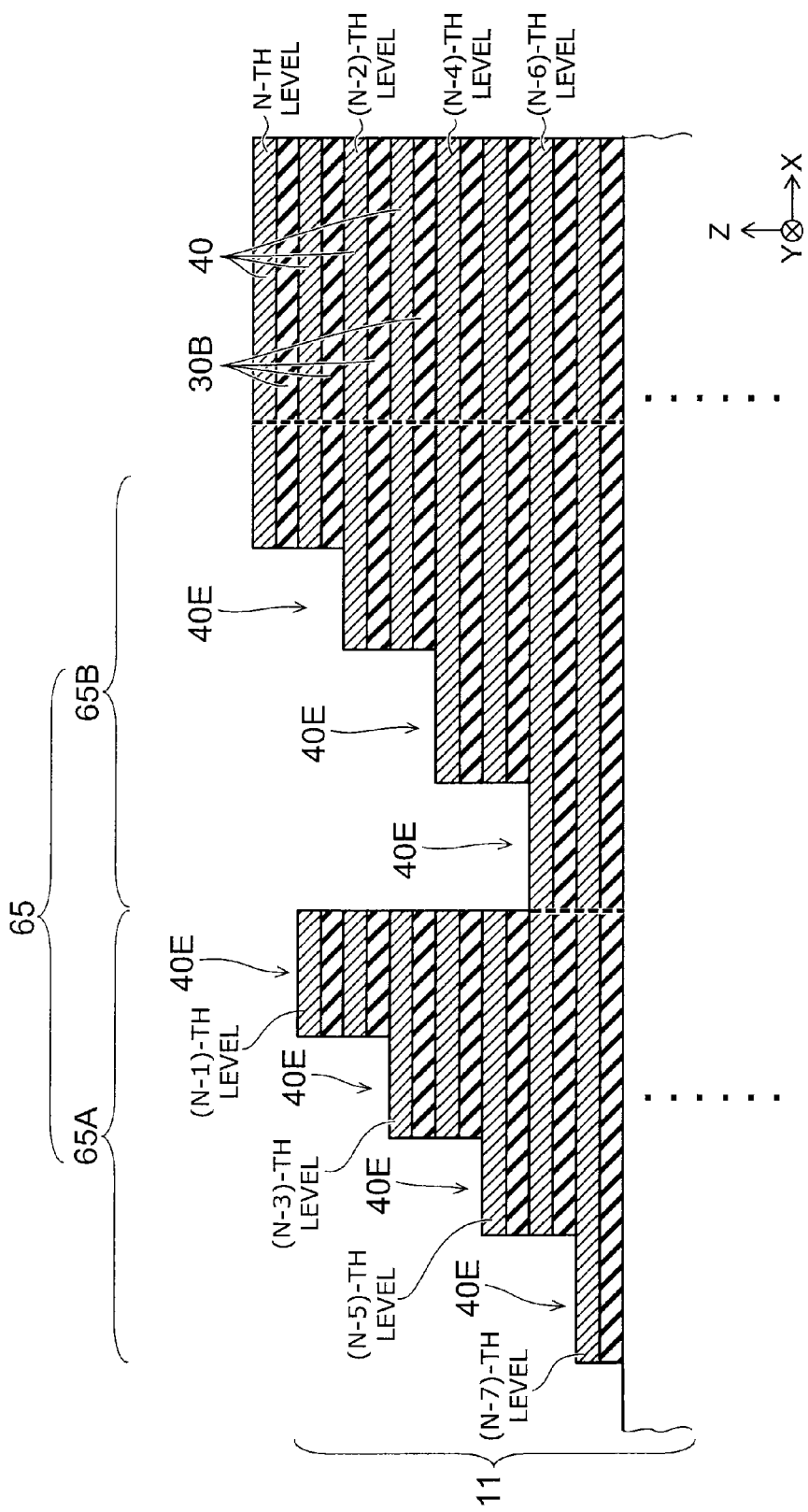
FIG. 9 is a schematic sectional view of a stacked body according to a second embodiment.

FIG. 9 is a schematic sectional view of a stacked body according to a second embodiment.

More specifically, FIG. 9 shows a cross section cutting the stacked body 11 along the X-Z plane at a prescribed position in the Y direction. In this stacked body 11, besides in the X direction, a step sequence exists also in the Y direction.

In the second embodiment, the plurality of staircase regions 65 include a staircase region 65A and a staircase region 65B.

In the second embodiment, the exposed portion 40E of each of the plurality of electrode layers 40 at the odd-numbered levels in the plurality of electrode layers stacked in the stacked body 11 is provided in the staircase region 65A. The exposed portion 40E of each of the plurality of electrode layers 40 at the even-numbered levels in the plurality of electrode layers 40 is provided in the staircase region 65B. Alternatively, the exposed portion 40E of each of the plurality of electrode layers 40 at the even-numbered levels may be provided in the staircase region 65A. The exposed portion 40E of each of the plurality of electrode layers 40 at the odd-numbered levels may be provided in the staircase region 65B.

For instance, in FIG. 9, the exposed portion 40E of each of the plurality of electrode layers 40 at the odd-numbered levels (e.g., (N−1)-th level, (N−3)-th level, (N−5)-th level, (N−7)-th level, . . . , fifth level, third level, and first level) in the plurality of electrode layers stacked in the stacked body 11 of N layers (N being an even number) is provided in the staircase region 65A. The exposed portion 40E of each of the plurality of electrode layers 40 at the even-numbered levels (e.g., N-th level, (N−2)-th level, (N−4)-th level, (N−6)-th level, . . . , sixth level, fourth level, and second level) in the plurality of electrode layers 40 is provided in the staircase region 65B. The step sequence in the X direction is a step sequence in which the exposed portions 40E of the plurality of electrode layers 40 are lowered by a plurality of steps for each shift in the X direction. Alternatively, the step sequence in the Y direction may be a step sequence in which the exposed portions 40E of the plurality of electrode layers 40 are lowered by a plurality of steps for each shift in the Y direction. Such a structure also achieves the same effect as the first embodiment.

As above, the embodiments have been described with reference to specific examples. However, the embodiments are not limited to such specific examples. In other words, these specific examples to which design changes are appropriately made by those skilled in the art shall be included in the scope of the embodiment as long as they include features of the embodiment. Each element, the disposition thereof, the material, the conditions, the shape, the size, and the like, which are included in each specific example described above are not limited to those that have been illustrated but may be appropriately changed.

In addition, the elements included in each embodiment described above can be combined as long as it is technically possible, and a combination thereof contains the scope of the embodiment, as long as it includes the features of the embodiment. Furthermore, in the scope of the concept of the embodiment, various variations or modifications may be considered by those skilled in the art, and it is understood that such variations and modifications belong to the scope of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
    a foundation layer; and
    a stacked body provided on the foundation layer, each of a plurality of electrode layers and each of a plurality of insulating layers being stacked alternately in the stacked body;
    a select gate electrode provided on the stacked body;
    a semiconductor layer extending from an upper end of the select gate electrode to a lower end of the stacked body;
    a first insulating film provided between the semiconductor layer and each of the plurality of electrode layers; and
    a second insulating film provided between the select gate electrode and the semiconductor layer,
    the stacked body including a plurality of staircase regions,
    the each of the plurality of electrode layers including an exposed portion, and the exposed portion being not covered with the plurality of electrode layers other than the each of the plurality of electrode layers and the plurality of insulating layers, and
    the exposed portion of each of the plurality of electrode layers being disposed in one of the plurality of staircase regions.

2. The device according to claim 1, wherein each of the plurality of staircase regions includes first steps and second steps, the first steps are formed by at least one row of the exposed portions arranged in a first direction perpendicular to stacking direction of the stacked body, and the second steps are formed by at least one row of the exposed portions arranged in a second direction perpendicular to the stacking direction and the first direction.

3. The device according to claim 2, wherein a height difference between the exposed portion of any of the plurality of electrode layers and an exposed portion next the any of the plurality of electrode layers is thickness of a pair of the electrode layer and the insulating layer.

4. The device according to claim 2, wherein a height difference between the exposed portion of any of the plurality of electrode layers and an exposed portion next the any of the plurality of electrode layers is thickness of a plurality of pairs of the electrode layer and the insulating layer.

5. The device according to claim 1, wherein the plurality of staircase regions are arranged in a row in longitudinal direction of the stacked body.

6. The device according to claim 1, wherein
    the plurality of staircase regions include a first staircase region and a second staircase region,
    the first staircase region and the second staircase region are arranged in the first direction,
    the second staircase region is disposed on a side of the semiconductor layer than the first staircase region side, and
    the exposed portion of each of the plurality of electrode layers in lower part of the stacked body is provided in the first staircase region, and the exposed portion of each of the plurality of electrode layers in upper part of the stacked body is provided in the second staircase region, or
    the exposed portion of each of the plurality of electrode layers in upper part of the stacked body is provided in the first staircase region, and the exposed portion of each of the plurality of electrode layers in lower part of the stacked body is provided in the second staircase region.

7. The device according to claim 6, wherein
    the exposed portion of each of the plurality of electrode layers in lower half of the stacked body is provided in the first staircase region, and the exposed portion of each of the plurality of electrode layers in upper half of the stacked body is provided in the second staircase region, or
    the exposed portion of each of the plurality of electrode layers in upper half of the stacked body is provided in the first staircase region, and the exposed portion of each of the plurality of electrode layers in lower half of the stacked body is provided in the second staircase region.

8. The device according to claim 1, wherein
    the plurality of staircase regions include a first staircase region and a second staircase region,
    the first staircase region and the second staircase region are arranged in the first direction,
    the second staircase region is disposed on a side of the semiconductor layer than the first staircase region side, and
    the exposed portion of each of the plurality of electrode layers at odd-numbered levels in the plurality of electrode layers stacked in the stacked body is provided in the first staircase region, and the exposed portion of each of the plurality of electrode layers at even-numbered levels in the plurality of electrode layers is provided in the second staircase region, or
    the exposed portion of each of the plurality of electrode layers at even-numbered levels in the plurality of electrode layers stacked in the stacked body is provided in the first staircase region, and the exposed portion of each of the plurality of electrode layers at odd-numbered levels in the plurality of electrode layers is provided in the second staircase region.

9. The device according to claim 8, wherein a height difference between the exposed portion of any of the plurality of electrode layers and an exposed portion next the any of the plurality of electrode layers is thickness of a plurality of pairs of the electrode layer and the insulating layer.

10. The device according to claim 1, wherein the exposed portion has a rectangular planar shape.

11. The device according to claim 1, further comprising:
    an interconnect connected to the exposed portion.

* * * * *

UNITED STATES PATENT AND TRADEMARK OFFICE
CERTIFICATE OF CORRECTION

PATENT NO. : 8,890,229 B2  
APPLICATION NO. : 14/012218  
DATED : November 18, 2014  
INVENTOR(S) : Nobutaka Watanabe Page 1 of 1

It is certified that error appears in the above-identified patent and that said Letters Patent is hereby corrected as shown below:

On the title page, Item (30), The Foreign Application Priority Data has been omitted. Item (30) should read:

-- (30)    Foreign Application Priority Data

Mar. 19, 2013 (JP)....................2013-057268 --

Signed and Sealed this  
Third Day of March, 2015

Michelle K. Lee  
*Deputy Director of the United States Patent and Trademark Office*